(12) United States Patent
Shi et al.

(10) Patent No.: US 12,464,933 B2
(45) Date of Patent: Nov. 4, 2025

(54) DISPLAY PANEL AND DISPLAY APPARATUS

(71) Applicants: Chengdu BOE Optoelectronics Technology Co., Ltd., Sichuan Province (CN); BOE Technology Group Co., Ltd., Beijing (CN)

(72) Inventors: Bo Shi, Beijing (CN); Chi Yu, Beijing (CN); Zeyu Li, Beijing (CN); Yina Peng, Beijing (CN); Yue Tian, Beijing (CN); Weiyun Huang, Beijing (CN); Yaqiong Wang, Beijing (CN)

(73) Assignees: Chengdu BOE Optoelectronics Technology Co., Ltd., Chengdu (CN); Beijing BOE Technology Development Co., Ltd., Beijing (CN)

( * ) Notice: Subject to any disclaimer, the term of this patent is extended or adjusted under 35 U.S.C. 154(b) by 446 days.

(21) Appl. No.: 18/042,975

(22) PCT Filed: Mar. 3, 2022

(86) PCT No.: PCT/CN2022/079124
§ 371 (c)(1),
(2) Date: Feb. 24, 2023

(87) PCT Pub. No.: WO2023/273383
PCT Pub. Date: Jan. 5, 2023

(65) Prior Publication Data
US 2024/0032402 A1    Jan. 25, 2024

(30) Foreign Application Priority Data

Jun. 29, 2021 (CN) .......................... 202110724827.7

(51) Int. Cl.
*H10K 59/80* (2023.01)
*H10K 59/40* (2023.01)

(52) U.S. Cl.
CPC .......... *H10K 59/879* (2023.02); *H10K 59/40* (2023.02); *H10K 59/80* (2023.02); *H10K 59/873* (2023.02)

(58) Field of Classification Search
CPC .... H10K 59/879; H10K 59/40; H10K 59/873; H10K 59/80
See application file for complete search history.

(56) References Cited

U.S. PATENT DOCUMENTS

| 2020/0227489 A1 | 7/2020 | Kim et al. |
| 2020/0303472 A1 | 9/2020 | Lou et al. |

(Continued)

FOREIGN PATENT DOCUMENTS

| CN | 110265452 A | 9/2019 |
| CN | 110911440 A | 3/2020 |

(Continued)

*Primary Examiner* — Joseph L Williams
(74) *Attorney, Agent, or Firm* — Workman Nydegger

(57) ABSTRACT

An apparatus includes a display panel and a display apparatus. The display panel includes: a substrate; a plurality of light-emitting devices having different light-emitting areas, the light-emitting devices being located on the substrate; a first refractive index layer, which includes opening regions corresponding to the light-emitting devices, projections of the opening regions on the substrate at least partially overlapping with projections of the light-emitting devices on the substrate, the contour shapes of the cross sections of sidewalls of at least a portion of the opening regions in the direction parallel to the substrate surface including concave-convex curves, and the first refractive index layer being used to reflect light emitted by the light-emitting devices on the sidewalls; and a second refractive index layer, which is located on the side of the first refractive index layer facing away from the substrate.

20 Claims, 9 Drawing Sheets

(56) References Cited

U.S. PATENT DOCUMENTS

2021/0175300 A1    6/2021  Kim et al.
2025/0040416 A1*   1/2025  Wang .................. H10K 59/8792

FOREIGN PATENT DOCUMENTS

| CN | 111446379 A | 7/2020 |
| CN | 112951885 A | 6/2021 |
| CN | 215578616 U | 1/2022 |

* cited by examiner

DISPLAY PANEL AND DISPLAY APPARATUS

CROSS REFERENCE TO RELATED APPLICATIONS

The present application is a US National Stage of International Application No. PCT/CN2022/079124, filed on Mar. 3, 2022, which claims priority to Chinese Patent Application No. 202110724827.7, entitled "DISPLAY PANEL AND DISPLAY APPARATUS", filed to the China Patent Office on Jun. 29, 2021, the entire contents of which are incorporated herein by reference.

FIELD

The present disclosure relates to the technical field of display, in particular to a display panel and a display apparatus.

BACKGROUND

Compared with a liquid crystal display (LCD), an organic electroluminescent display (OLED) has the advantages of self-illumination, fast response, wide viewing angle, high brightness, bright color, lightness, thinness and the like. It is one of hotspots in the field of display research and is considered as the next generation of a display technology.

SUMMARY

Embodiments of the present disclosure provide a display panel and a display apparatus to improve a light-emitting efficiency of blue sub-pixels.

Therefore, an embodiment of the present disclosure provides a display panel, including:
  a substrate;
  a plurality of light emitting devices with different light emitting areas, where the light emitting devices are located on the substrate;
  a first refractive index layer, including a plurality of opening regions corresponding to the plurality of light emitting devices, where projections of the opening regions on the substrate at least partially overlap projections of the light emitting devices on the substrate, a contour shape of a cross section of a side wall of at least part of the opening regions in a direction parallel to a surface of the substrate include a plurality of concave-convex curves, and the first refractive index layer is configured to reflect light emitted by the light emitting devices on the side wall; and
  a second refractive index layer, located on a side, facing away from the substrate, of the first refractive index layer; where the second refractive index layer is arranged on a whole surface and fills the plurality of opening regions, and a refractive index of the second refractive index layer is greater than a refractive index of the first refractive index layer.

Optionally, in the above display panel provided by the embodiment of the present disclosure, in the direction parallel to the surface of the substrate, in the side wall of the opening region corresponding to the light emitting device with a maximum light emitting area, a top edge and/or a bottom edge of the side wall includes a plurality of concave-convex curves.

Optionally, in the above display panel provided by the embodiment of the present disclosure, the substrate includes a plurality of first sub-pixel regions, a plurality of second sub-pixel regions and a plurality of third sub-pixel regions of different colors; the plurality of light emitting devices with different light emitting areas include a first area light emitting device, a second area light emitting device and a third area light emitting device; and the first area light emitting device corresponds to the first sub-pixel region, the second area light emitting device corresponds to the second sub-pixel region, and the third area light emitting device corresponds to the third sub-pixel region;
  where a light-emitting efficiency of the third sub-pixel region is lower than a light-emitting efficiency of the first sub-pixel region and a light-emitting efficiency of the second sub-pixel region; and in the side wall of the opening region corresponding to the third sub-pixel region, a top edge and/or a bottom edge of the side wall includes a plurality of concave-convex curves.

Optionally, in the above display panel provided by the embodiment of the present disclosure, in the direction parallel to the surface of the substrate, a shape of each of the curves is an 'S' shape or a 'Z' shape.

Optionally, in the above display panel provided by the embodiment of the present disclosure, in a thickness direction of the substrate, a cross-sectional shape of each of the opening regions is approximately an inverted trapezoid.

Optionally, the above display panel provided by the embodiment of the present disclosure further includes a micro-lens structure located in at least part of the opening regions; an area of an orthographic projection of the micro-lens structure on the substrate is smaller than an area of an orthographic projection of the at least part of the opening regions on the substrate; and the micro-lens structure and the first refractive index layer are arranged on the same layer.

Optionally, in the above display panel provided by the embodiment of the present disclosure, the micro-lens structure is located in the opening region corresponding to the light emitting device with the maximum light emitting area.

Optionally, in the above display panel provided by the embodiment of the present disclosure, the micro-lens structure is located in a central region of the opening region.

Optionally, in the above display panel provided by the embodiment of the present disclosure, an angle of gradient of the micro-lens structure and an angle of gradient of the first refractive index layer are approximately the same, and a height of the micro-lens structure and a height of the first refractive index layer are the same.

Optionally, in the above display panel provided by the embodiment of the present disclosure, a cross-sectional shape of the micro-lens structure in the thickness direction of the substrate is a regular trapezoid, a triangle or a circular arc.

Optionally, in the above display panel provided by the embodiment of the present disclosure, the angle of gradient of the micro-lens structure ranges from 50° to 70°, and a width of a bottom edge of a cross section of the micro-lens structure in the thickness direction of the substrate ranges from 1 μm to 8 μm.

Optionally, the above display panel provided by the embodiment of the present disclosure further includes an encapsulation layer located on a side, facing away from the substrate, of the second refractive index layer; each light emitting device includes an anode, a light emitting layer and a cathode sequentially arranged on the substrate in a stacked mode; and the first refractive index layer is located between the cathode and the second refractive index layer.

Optionally, in the above display panel provided by the embodiment of the present disclosure, a material of the first refractive index layer includes polyimide, and a material of the second refractive index layer includes SiNx.

Optionally, the above display panel provided by the embodiment of the present disclosure further includes an encapsulation layer located between the light emitting devices and the first refractive index layer.

Optionally, the above display panel provided by the embodiment of the present disclosure further includes a touch structure located between the encapsulation layer and the second refractive index layer, and a flat layer located between the touch structure and the second refractive index layer; and the flat layer is multiplexed as the first refractive index layer.

Optionally, in the above display panel provided by the embodiment of the present disclosure, the touch structure includes a first touch electrode layer, a touch insulation layer and a second touch electrode layer which are stacked; the first touch electrode layer is close to the substrate; and the first refractive index layer is arranged on a side, far away from the substrate, of the second touch electrode layer.

Optionally, in the above display panel provided by the embodiment of the present disclosure, the first touch electrode layer and the second touch electrode layer include a plurality of metal grids, the metal grids include a plurality of metal wires, the plurality of metal wires are staggered to define meshes of the metal grids, an orthographic projection of each of the metal wires on the substrate is located between the adjacent light emitting devices, and the first refractive index layer covers the metal wires.

Optionally, in the above display panel provided by the embodiment of the present disclosure, a material of the first refractive index layer includes resin, and a material of the second refractive index layer includes resin mixed with acrylic particles or an acrylic material.

Optionally, in the above display panel provided by the embodiment of the present disclosure, the light emitting devices include a red light emitting device, a green light emitting device and a blue light emitting device; and the light emitting device with the maximum light emitting area is the blue light emitting device.

Optionally, in the above display panel provided by the embodiment of the present disclosure, an area of an orthographic projection of the opening region on the substrate is greater than or equal to an area of an orthographic projection of an effective light emitting region of a corresponding light emitting device on the substrate.

Accordingly, an embodiment of the present disclosure further provides a display apparatus, including the any above display panel.

DETAILED DESCRIPTION OF THE EMBODIMENTS

In order to make objectives, technical solutions and advantages of the present disclosure clearer, the present disclosure will be further described in detail in conjunction with accompanying drawings below. Apparently, the described embodiments are only part of the embodiments of the present disclosure, not all of them. Based on the embodiments of the present disclosure, all other embodiments obtained by those of ordinary skill in the art without creative labor fall within the scope of protection of the present disclosure.

A shape and a size of each component in the accompanying drawings do not reflect true scales, and are only intended to schematically illustrate the content of the present disclosure.

Figure 1:
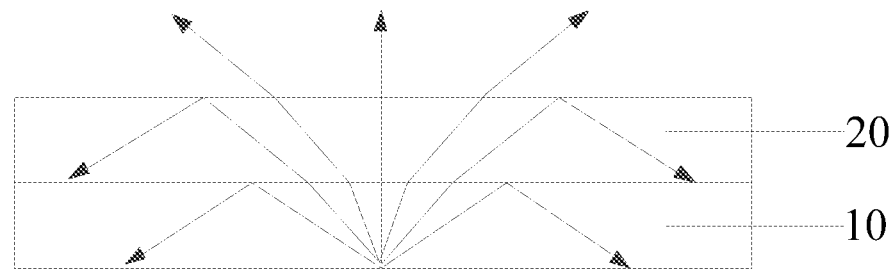
FIG. 1 is a schematic structural diagram of a display panel provided in the related art.

In a traditional OLED, as shown in FIG. 1, since light emitted by a light emitting device is finally emitted into air (a low refractive index) from a glass cover plate 20 (a high refractive index), when an incident angle of the light on an interface of the glass cover 20 reaches or is greater than a critical angle of total reflection, total internal reflection will occur, and most of the emitted light may be totally reflected in the device and scattered to be consumed, resulting in a low overall light-emitting efficiency.

Figure 2:
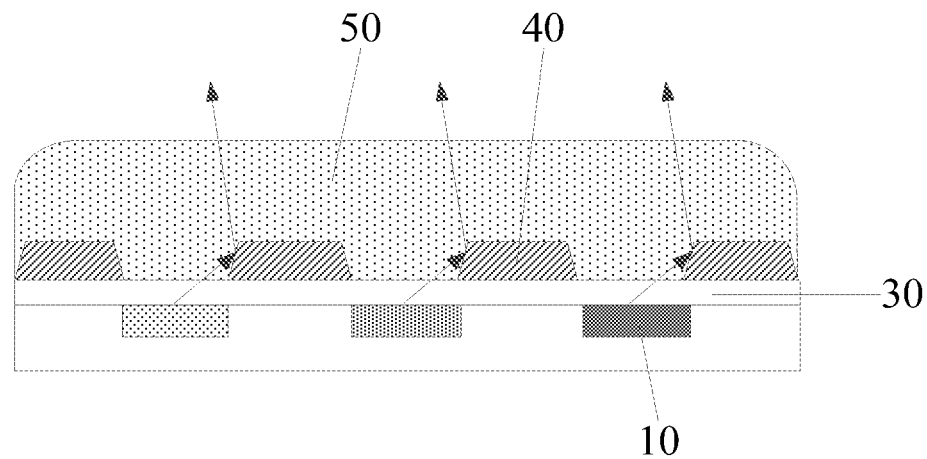
FIG. 2 is a schematic structural diagram of another display panel provided in the related art.

In order to improve the light-emitting efficiency of the OLED, as shown in FIG. 2, a micro lens 40 may be manufactured outside an encapsulation layer 30, that is, the micro lens 40 with a low refractive index and a flat layer 50 with a high refractive index are adopted to adjust the incident angle when the light reaches the interface of the glass cover plate 20 by using a total reflection principle, total internal reflection of the light in a squint angle direction is reduced, and the light-emitting efficiency is improved.

A traditional RGB pixel arrangement mode can no longer meet requirements of high-resolution products, in order to have a larger proportion of a sub-pixel light emitting area under the premise of an equivalent display effect, a GGRB pixel arrangement mode is widely used at present, and the GGRB pixel arrangement mode may effectively improve a screen burning problem.

Figure 3:
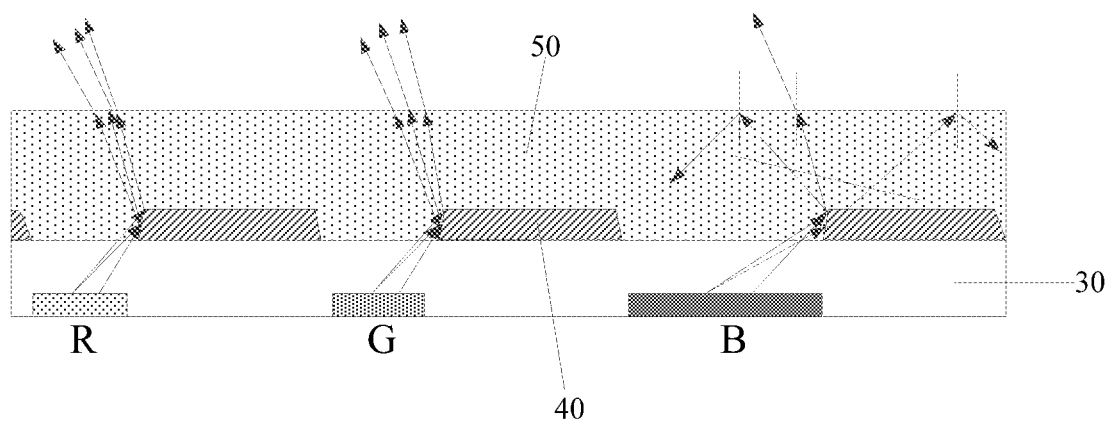
FIG. 3 is a schematic structural diagram of another display panel provided in the related art.

However, in GGRB pixel arrangement, as shown in FIG. 3, due to a larger area of a pixel B, a lot of light emitted by the pixel B does not reach the critical angle of total reflection when it reaches the interface of the micro lens 40, and finally cannot be emitted from a surface of the glass cover plate, resulting in brightness gain of blue light far lower than that of red light and green light.

Based on this, in order to solve the problem that the brightness gain of the blue light is far lower than that of the red light and green light, embodiments of the present disclosure provide a display panel, as shown in FIG. 4-FIG. 7, including:

a substrate 1;

a plurality of light emitting devices (21, 22 and 23) with different light emitting areas, where the light emitting devices (21, 22 and 23) are located on the substrate 1;

a first refractive index layer 3, including a plurality of opening regions (31, 32 and 33) corresponding to the plurality of light emitting devices (21, 22 and 23), where projections of the opening regions (such as 31) on the substrate 1 at least partially overlap projections of the light emitting device 21 on the substrate 1, a contour shape of a cross section of a side wall 331 of at least part of the opening regions (such as 33) in a direction parallel to a surface of the substrate 1 includes a plurality of concave-convex curves, and the first refractive index layer 3 is configured to reflect light emitted by the light emitting devices (21, 22 and 23) on the side wall 331; and a second refractive index layer 4, located on a side, facing away from the substrate 1, of the first refractive index layer 3; where the second refractive index layer 4 is arranged on a whole surface and fills all opening regions (31, 32 and 33), and a refractive index of the second refractive index layer 4 is greater than a refractive index of the first refractive index layer 3.

Figure 4:
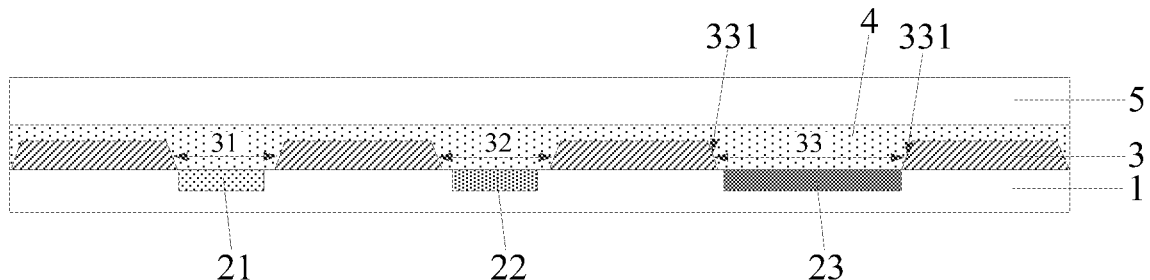
FIG. 4 is a schematic structural diagram of a display panel provided by an embodiment of the present disclosure.
Figure 5:
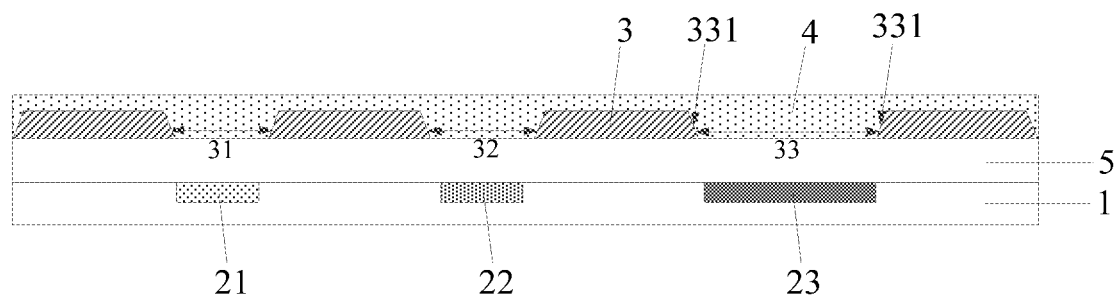
FIG. 5 is a schematic structural diagram of another display panel provided by an embodiment of the present disclosure.
Figure 6:
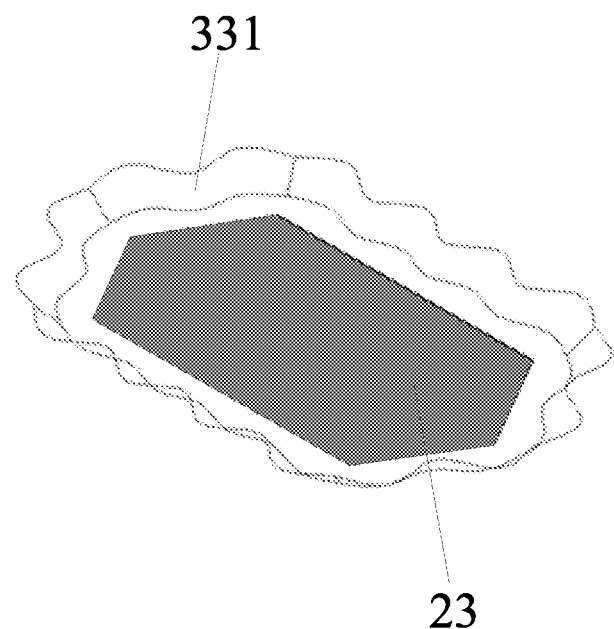
FIG. 6 is a schematic structural diagram of the light emitting device 23 and the side wall 331 in FIG. 4 and FIG. 5.
Figure 7:
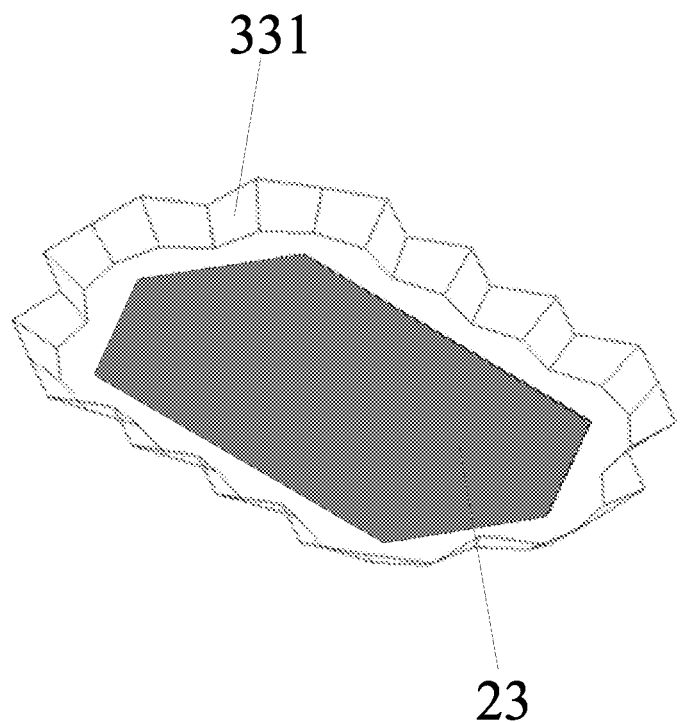
FIG. 7 is another schematic structural diagram of the light emitting device 23 and the side wall 331 in FIG. 4 and FIG. 5.

It should be noted that FIG. 4 and FIG. 5 are two schematic cross-sectional views of the display panel; FIG. 6 and FIG. 7 may be two schematic top views of the light emitting device 23, the opening region 33 and the first refractive index layer 3 in FIG. 4; and FIG. 6 and FIG. 7 may also be two schematic top views of the light emitting device 23, the opening region 33 and the first refractive index layer 3 in FIG. 5.

According to the above display panel provided by the embodiments of the present disclosure, since the second refractive index layer 4 with the high refractive index covers the opening regions (31, 32 and 33), and the first refractive index layer 3 is a layer with a low refractive index, the side walls 331 of the opening regions (such as 33) are the interface where the light emitted by the light emitting devices 23 are totally reflected. In the present disclosure, a contour shape of a cross section of the side wall 331 of the at least part of the opening regions (such as 33) of the first refractive index layer 3 in a direction parallel to a surface of the substrate 1 is set to include a plurality of concave-convex curves, in this way, an area of the side wall 331 of the opening region 33 may be increased, an interface area of total reflection may be increased, so that the number of light that is totally reflected is improved, and then the light emitting gain of the light emitting device 23 is improved.

During specific implementation, the above display panel provided by the embodiments of the present disclosure, as shown in FIG. 4, further includes an encapsulation layer 5 located on a side, facing away from the substrate 1, of the second refractive index layer 4; that is, the first refractive index layer 3 and the second refractive index layer 4 provided by the embodiments of the present disclosure are manufactured before the encapsulation of the display panel. Each of the light emitting devices (21, 22 and 23) includes an anode, a light emitting layer and a cathode (not shown) which are sequentially arranged on the substrate 1 in a stacked mode; and the first refractive index layer 3 is located between the cathode and the second refractive index layer 4.

During specific implementation, in the above display panel provided by the embodiments of the present disclosure, as shown in FIG. 4, a material of the first refractive index layer 3 may include polyimide, and a material of the second refractive index layer 4 may include SiNx. Specifically, when the display panel is manufactured, it is necessary to manufacture a pixel defining layer (PDL) to define the pixel opening regions, the light emitting devices are manufactured in the corresponding pixel opening regions, and a material of the PDL is generally polyimide, so that the first refractive index layer 3 in the embodiments of the present disclosure may be manufactured of the material of the PDL. Specifically, a refractive index of polyimide is 1.65, and a refractive index of SiNx is 1.94.

It should be noted that in the embodiments of the present disclosure, FIG. 4 takes a situation that the material of the first refractive index layer is the material (polyimide) of the PDL, and the material of the second refractive index layer includes SiNx as an example for illustration, which may facilitate manufacturing. Of course, during specific implementation, the first refractive index layer and the second refractive index layer may also be made of other different materials, as long as the two meet the requirements that the refractive index of the second refractive index layer is greater than the refractive index of the first refractive index layer.

During specific implementation, the above display panel provided by the embodiments of the present disclosure, as shown in FIG. 5, further includes an encapsulation layer 5 located between the light emitting devices (21, 22 and 23) and the first refractive index layer 3, that is, the first refractive index layer 3 and the second refractive index layer 4 provided by the embodiments of the present disclosure are manufactured after the encapsulation of the display panel.

Figure 8:
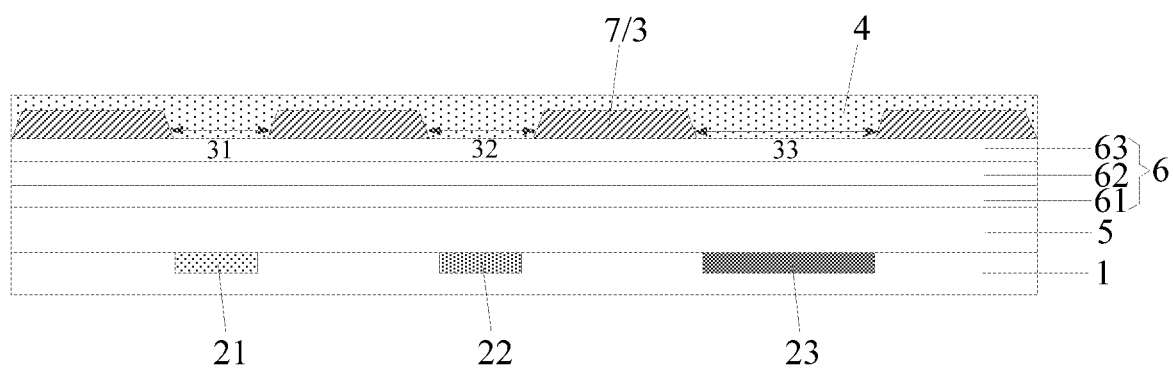
FIG. 8 is a schematic structural diagram of another display panel provided by an embodiment of the present disclosure.

During specific implementation, the above display panel provided by the embodiments of the present disclosure, as shown in FIG. 8, further includes: a touch structure 6 located between the encapsulation layer 5 and the second refractive index layer 4, and a flat layer 7 located between the touch structure 6 and the second refractive index layer 4; and the flat layer 7 is multiplexed as the first refractive index layer 3, so that the first refractive index layer 3 is not separately manufactured on the flat layer 7, which may save the production of a film layer. Specifically, the flat layer 7 is configured to flatten a surface of the touch structure 6 for a subsequent production process. Although the flat layer 7 is multiplexed as the first refractive index layer 3, the first refractive index layer 3 has the opening regions, and the second refractive index layer 4 is arranged on a whole surface and covers the opening regions, so the second refractive index layer 4 actually plays a flattening role.

Therefore, the embodiments of the present disclosure may not affect the flatness of the subsequent film layers.

During specific implementation, in the above display panel provided by the embodiments of the present disclosure, as shown in FIG. 8, the touch structure 6 includes a first touch electrode layer 61, a touch insulation layer 62 and a second touch electrode layer 63 which are stacked; the first touch electrode layer 61 is close to the substrate 1; and the first refractive index layer 3 is arranged on a side, far away from the substrate 1, of the second touch electrode layer 63. Specifically, one of the first touch electrode layer 61 and the second touch electrode layer 63 is a driving electrode, and the other is a sensing electrode.

Figure 9:
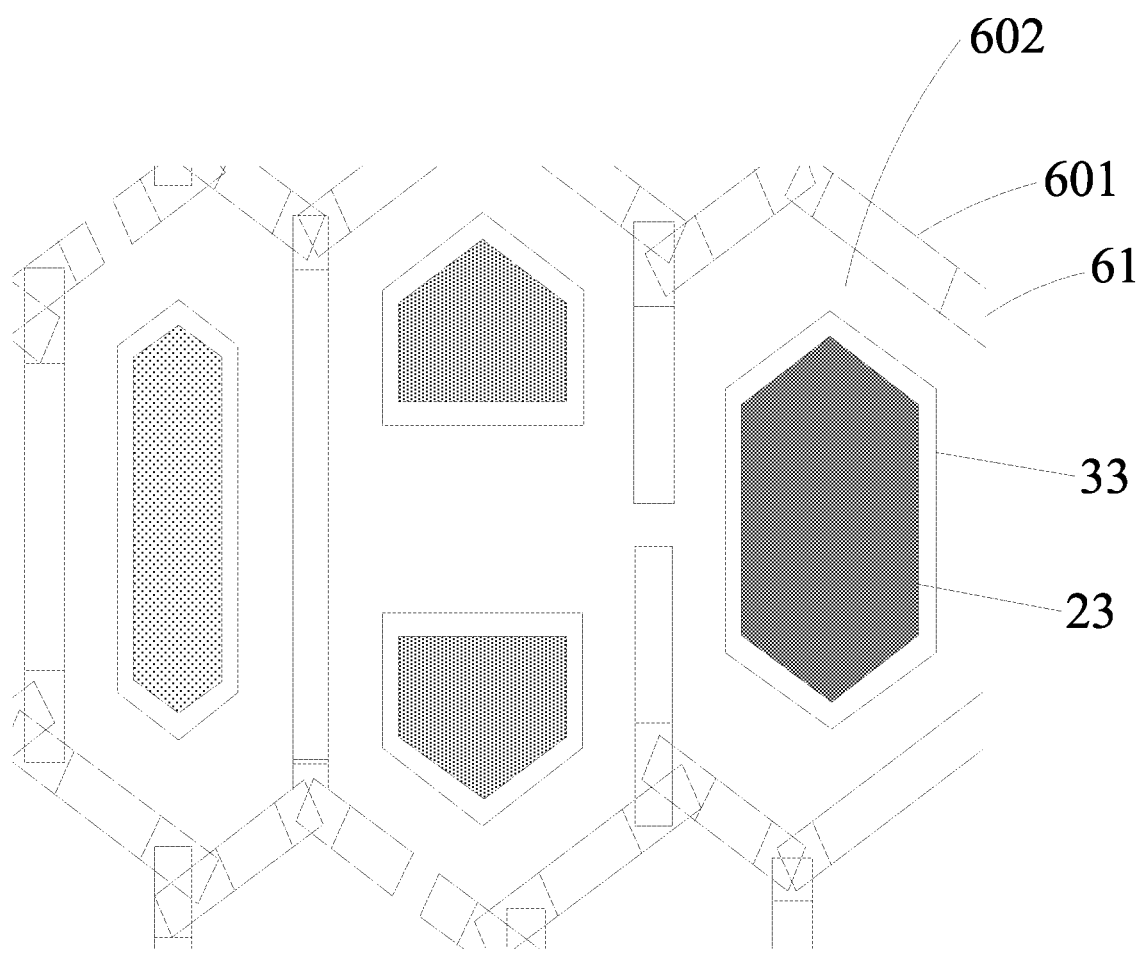
FIG. 9 is a schematic top view of a display panel provided by an embodiment of the present disclosure.

During specific implementation, in the above display panel provided by the embodiments of the present disclosure, as shown in FIG. 9, FIG. 9 is a schematic top view of part of film layers in FIG. 8, the first touch electrode layer 61 and the second touch electrode layer 63 include a plurality of metal grids, the metal grids include a plurality of metal wires 601, the plurality of metal wires 601 are staggered to define meshes 602 of the metal grids, an orthographic projection of each of the metal wires 601 on the substrate 1 is located between the adjacent light emitting devices, and the first refractive index layer 3 covers the metal wires 601.

During specific implementation, in the above display panel provided by the embodiments of the present disclosure, as shown in FIG. 5 and FIG. 8, a material of the first refractive index layer 3 may include resin (a material of the flat layer), and a material of the second refractive index layer 4 may include resin mixed with acrylic particles or an acrylic material. Specifically, a refractive index of the resin mixed with the acrylic particles is greater than a refractive index of a single resin material, and a refractive index of the acrylic material is greater than a refractive index of the resin.

During specific implementation, in order to make the light emitted by the light emitting devices be totally reflected on an interface of the first refractive index layer as much as possible, in the above display panel provided by the embodiments of the present disclosure, as shown in FIG. 4, FIG. 5 and FIG. 8, an area of an orthographic projection of the opening region (such as 33) on the substrate 1 is greater than or equal to an area of an orthographic projection of an effective light emitting region of the light emitting device 23 on the substrate 1.

Figure 10:
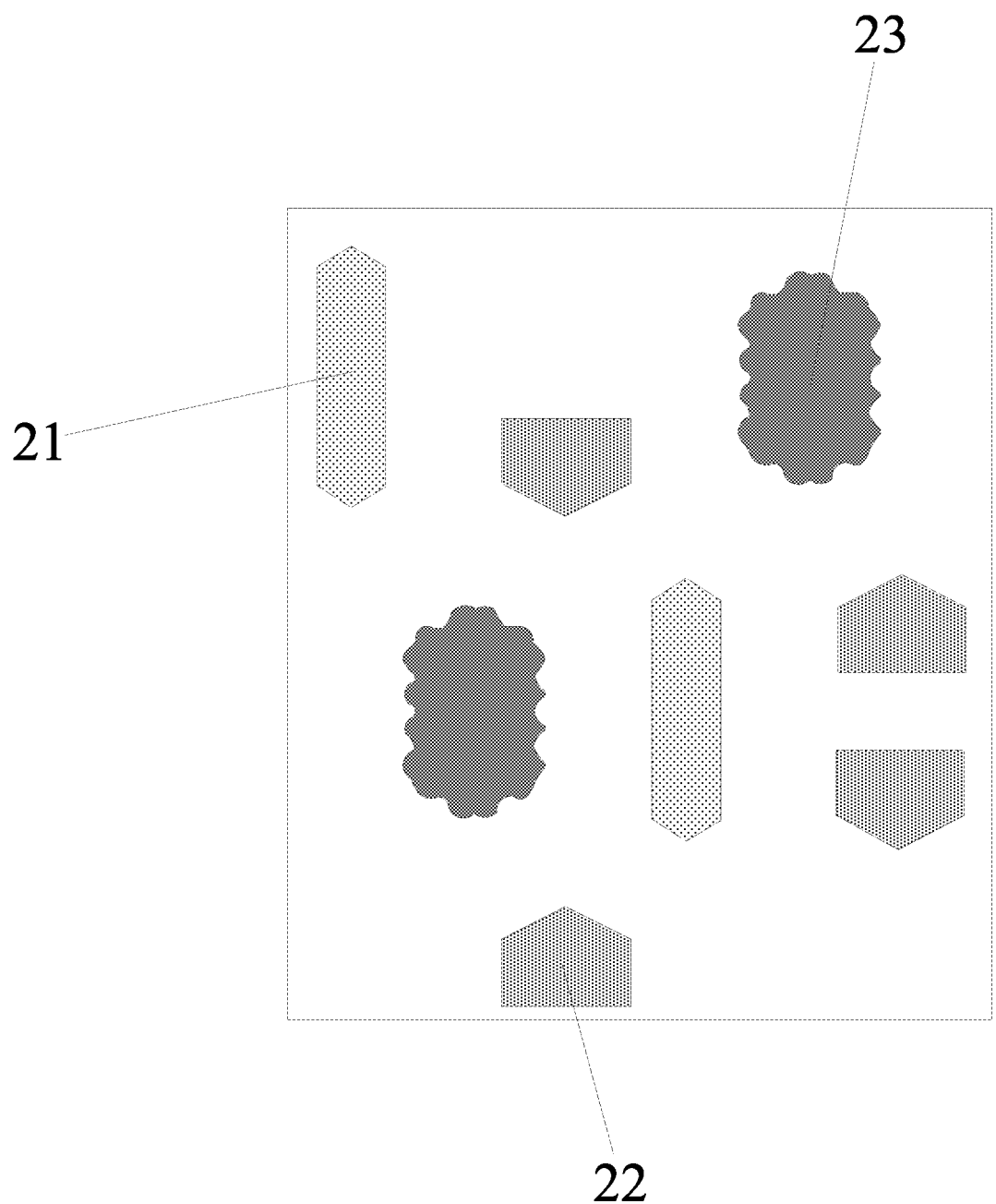
FIG. 10 is a schematic structural diagram of another display panel provided by an embodiment of the present disclosure.

During specific implementation, in order to have a larger proportion of a sub-pixel light emitting area under the premise of an equivalent display effect, as shown in FIG. 10, a GGRB pixel arrangement mode is adopted in the embodiments of the present disclosure, where 21 represents a sub-pixel R, 22 represents a sub-pixel G, and 23 presents a sub-pixel B, and the GGRB pixel arrangement mode may effectively improve a screen burning problem. Therefore, in the above display panel provided by the embodiments of the present disclosure, as shown in FIG. 4, FIG. 5 and FIG. 8, the light emitting devices (21, 22 and 23) may include a red light emitting device 21, a green light emitting device 22 and a blue light emitting device 23; and the light emitting device 23 with the maximum light emitting area is the blue light emitting device.

During specific implementation, in order to increase a light emitting angle of the light emitting devices, in the above display panel provided by the embodiments of the present disclosure, as shown in FIG. 4, FIG. 5 and FIG. 8, in a thickness direction of the substrate 1, a cross-sectional shape of each of the opening regions (31, 32 and 33) is approximately an inverted trapezoid.

Figure 11:
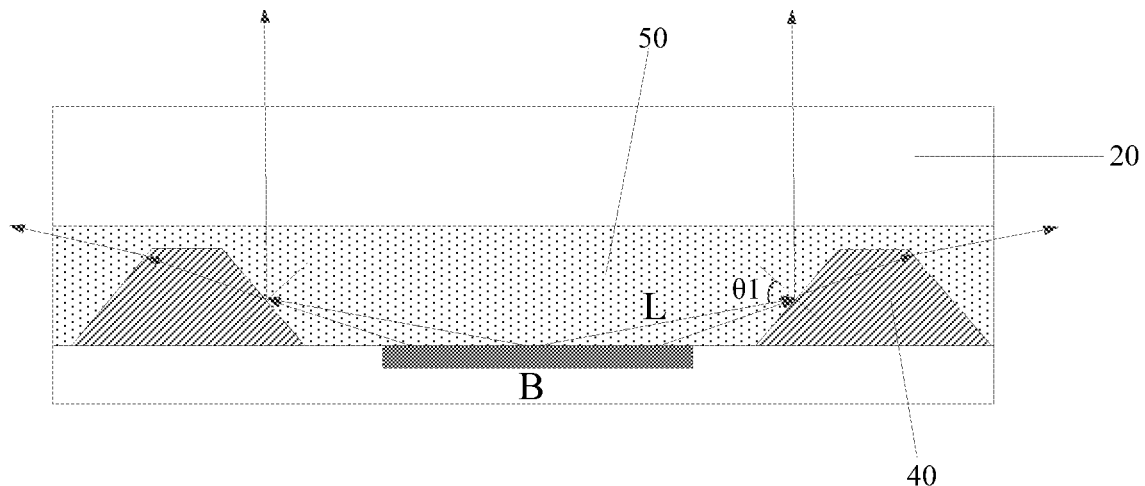
FIG. 11 is a schematic structural diagram of a display panel provided in the prior art.

During specific implementation, as shown in FIG. 4 and FIG. 10, due to a large light emitting area of the blue light emitting device 23, the refractive index n1 of the first refractive index layer 3 (polyimide) is 1.65, and the refractive index n2 of the second refractive index layer 4 (SiNx) is 1.94. As shown in FIG. 11, which is a schematic cross-sectional view of a pixel B shown in FIG. 3 in the prior art, an incident angle θ1 of a lot of light (such as light L in a central region of the pixel B) reaching the interface of the first refractive index layer 3 and the second refractive index layer 4 is smaller than a critical angle of total reflection (arcsin n1/n2=58°, and total internal reflection occurs again at an air interface after final refraction, resulting in a significant reduction in the light output gain of the pixel B. Therefore, in the above display panel provided by the embodiments of the present disclosure, as shown in FIG. 4-FIG. 7, in the direction parallel to the surface of the substrate 1, in the side wall 331 of the opening region 33 corresponding to the light emitting device 23 with a maximum light emitting area, a top edge and/or a bottom edge of the side wall 331 includes a plurality of concave-convex curves. In this way, the area of the side wall 331 of the opening region 33 may be increased, so that the interface area of total reflection may be increased, the number of light that is totally reflected is improved, and the light emitting gain of the blue light emitting device 23 is improved.

Specifically, the embodiments of the present disclosure take a situation that the top edge and the bottom edge of the side wall 331 both include a plurality of concave-convex curves as an example for illustration.

During specific implementation, in the above display panel provided by the embodiments of the present disclosure, as shown in FIG. 4 and FIG. 5, the substrate 1 includes a plurality of first sub-pixel regions R, a plurality of second sub-pixel regions G and a plurality of third sub-pixel regions B of different colors; the plurality of light emitting devices (21, 22 and 23) with different light emitting areas include a first area light emitting device 21, a second area light emitting device 22 and a third area light emitting device 23; and the first area light emitting device 21 corresponds to the first sub-pixel region R, the second area light emitting device 22 corresponds to the second sub-pixel region G, and the third area light emitting device 23 corresponds to the third sub-pixel region B; where a light-emitting efficiency of the third sub-pixel region B is lower than a light-emitting efficiency of the first sub-pixel region R and a light-emitting efficiency of the second sub-pixel region G; and in the side wall 331 of the opening region 33 corresponding to the third sub-pixel region B, a top edge and/or a bottom edge of the side wall 331 includes a plurality of concave-convex curves. Therefore, the area of the side wall 331 of the opening region 33 is increased, so that the interface area of total reflection may be increased, the number of light that is totally reflected is improved, and the light emitting gain of the light emitting device 23 corresponding to the third sub-pixel region B is improved.

During specific implementation, in the above display panel provided by the embodiments of the present disclosure, as shown in FIG. 4-FIG. 7, in the direction parallel to the surface of the substrate 1, a shape of each curve may be an 'S' shape or a 'Z' shape. Of course, the shape of each curve may also be other shapes.

Specifically, as shown in FIG. 6, the shape of the curves at the top edge and the bottom edge of the side wall 331 is the 'S' shape; and as shown in FIG. 7, the shape of the curves at the top edge and the bottom edge of the side wall 331 is the 'Z' shape. Of course, in FIG. 6 and FIG. 7, it may also be that the shape of the top edge is the 'S' shape, and the shape of the bottom edge is the 'Z' shape; or the shape of the top edge is the 'Z' shape, and the shape of the bottom edge is the 'S' shape.

Figure 12:
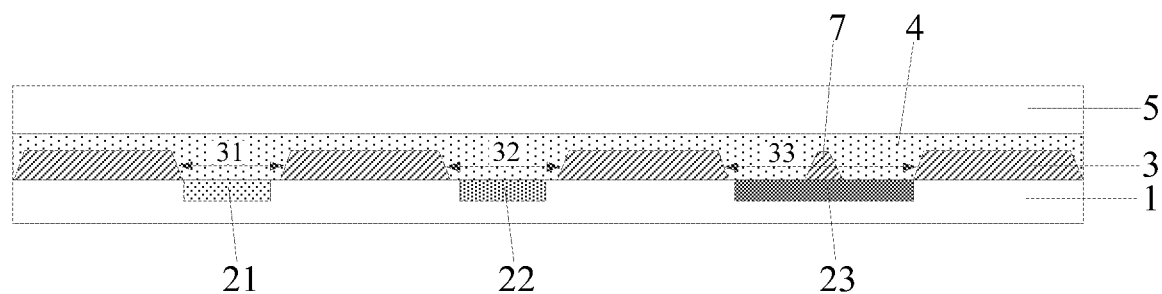
FIG. 12 is a schematic structural diagram of another display panel provided by an embodiment of the present disclosure.
Figure 13:
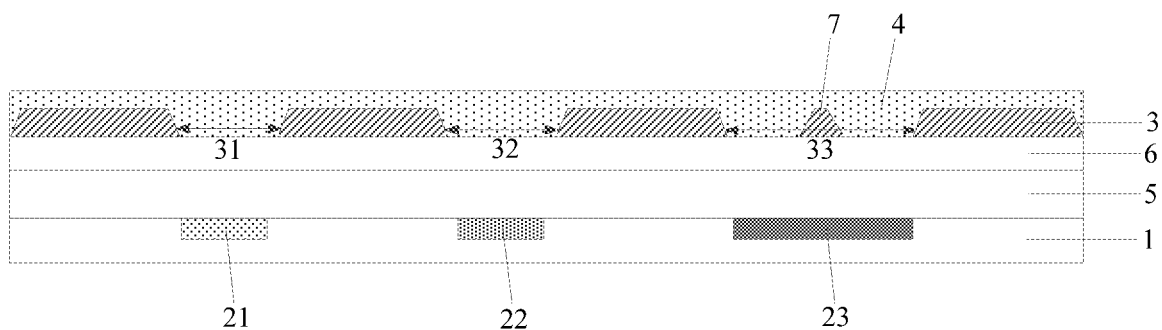
FIG. 13 is a schematic structural diagram of another display panel provided by an embodiment of the present disclosure.
Figure 14:
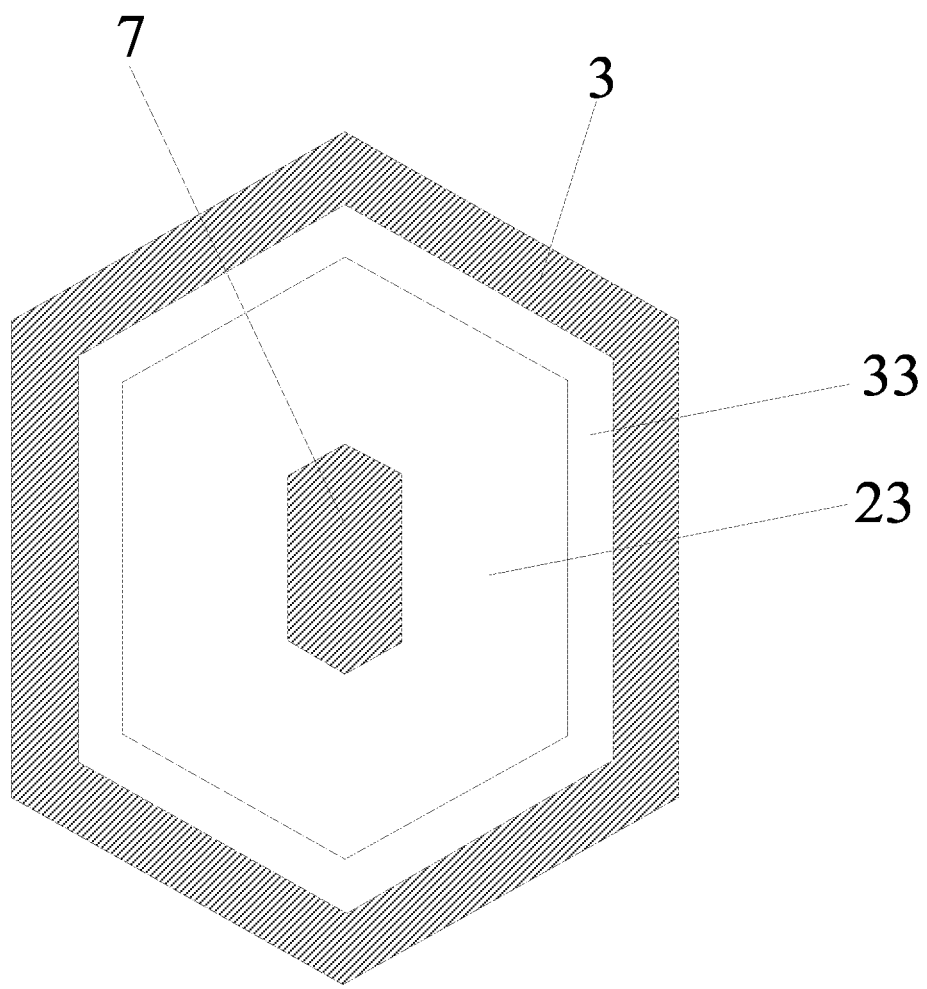
FIG. 14 is a schematic top view of a display panel provided by an embodiment of the present disclosure.

During specific implementation, the above display panel provided by the embodiments of the present disclosure, as shown in FIG. 12-FIG. 14, further includes a micro-lens structure 7 located in at least part of the opening regions (such as 33); an area of an orthographic projection of the micro-lens structure 7 on the substrate 1 is smaller than an area of an orthographic projection of the opening region 33 corresponding to the light emitting device 23 with the maximum light emitting area on the substrate 1; and the micro-lens structure 7 and the first refractive index layer 3 are arranged on the same layer. In this way, it is only necessary to change an original composition pattern when the first refractive index layer 3 is formed, patterns of the micro-lens structure 7 and the first refractive index layer 3 may be formed through a single patterning process without adding a process of preparing the micro-lens structure 7 separately, the preparation process may be simplified, a production cost is saved, and a production efficiency is improved.

It should be noted that FIG. 12 and FIG. 13 are another two schematic cross-sectional views of the display panel, and FIG. 14 is a schematic top view of the light emitting device 23, the opening region 33, the first refractive index layer 3 and the micro-lens structure 7 in FIG. 12 and FIG. 13.

During specific implementation, due to a large light emitting area of the blue light emitting device, an incident angle θ1 of a lot of light emitted by the blue light emitting device reaching the interface of the first refractive index layer and the second refractive index layer is smaller than a critical angle of total reflection, and total internal reflection occurs again at an air interface after final refraction, resulting in a significant reduction in the light emitting gain of the pixel B. Therefore, in the above display panel provided by the embodiments of the present disclosure, as shown in FIG. 12-FIG. 14, the micro-lens structure 7 is located in the opening region 33 corresponding to the light emitting device 23 with the maximum light emitting area.

Figure 15:
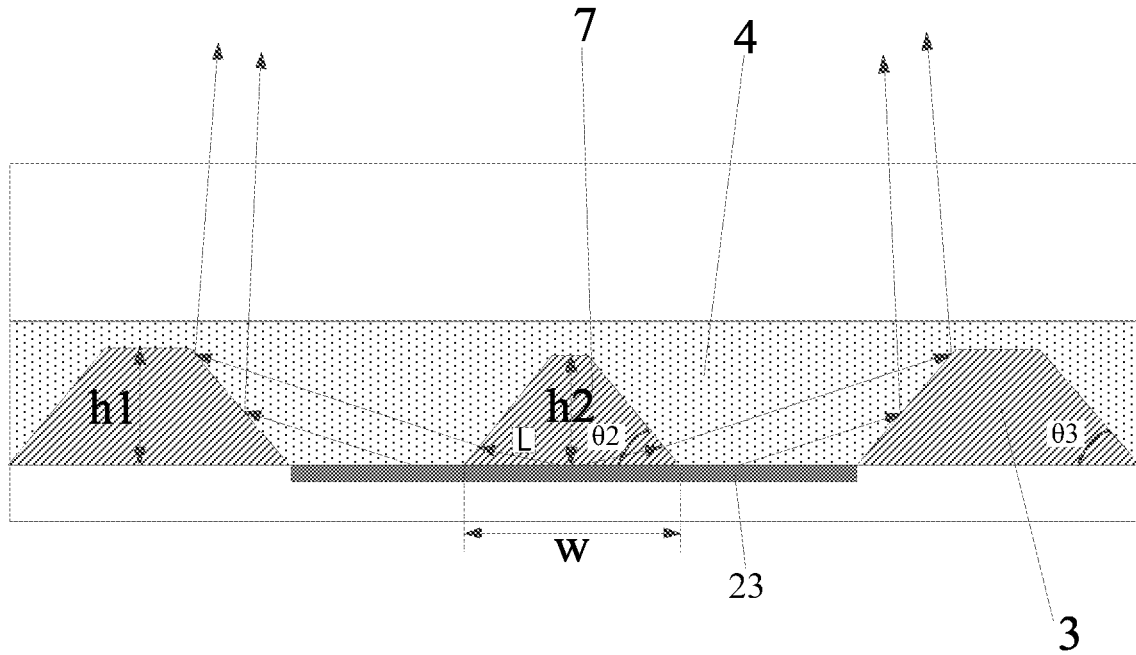
FIG. 15 is a schematic structural diagram of another display panel provided by an embodiment of the present disclosure.

Specifically, as shown in FIG. 15, FIG. 15 is an enlarged schematic diagram of the blue light emitting device 23, the first refractive index layer 3, the second refractive index layer 4 and the micro-lens structure 7 in FIG. 12 and FIG. 13. In the embodiments of the present disclosure, an independent micro-lens structure 7 is added in the opening region 33 corresponding to the blue light emitting device 23 based on the structure in FIG. 4 and FIG. 5. By using a refraction principle, a propagation direction of the light (such as the light L in the central region of the pixel B) with a small original incident angle may be changed (that is, the light is incident at the interface of the first refractive index layer 3 after a refraction at the interface of the micro-lens structure 7); and the incident angle when the light reaches the side wall of the opening region 33 may be increased, so that the incident angle reaches the critical angle of total reflection, so that the more light is reflected out, and the light emitting gain of the blue light emitting device 23 is further improved.

During specific implementation, since the incident angle of the light emitted by the central region of the blue light emitting device 23 reaching the interface of the first refractive index layer is small, in order to make the incident angle of the light emitted by the central region of the blue light emitting device 23 reaching the interface of the first refractive index layer reach the critical angle of total reflection, in the above display panel provided by the embodiments of the present disclosure, as shown in FIG. 12-FIG. 14, the micro-lens structure 7 is located in the central region of the opening region 23, and of course, the position of the micro-lens structure 7 may have a certain error with the central region of the opening region 23.

During specific implementation, in order to make the incident angle of the light emitted by the blue light emitting device 23 reaching the interface of the first refractive index layer reach the critical angle of total reflection as much as possible, in the above display panel provided by the embodiments of the present disclosure, as shown in FIG. 15, an angle of gradient θ2 of the micro-lens structure 7 and an angle of gradient θ3 of the first refractive index layer 3 are proximately the same, a height h1 of the micro-lens structure 7 and a height h2 of the first refractive index layer 3 are the same, and h1 and h2 preferably range from 2 μm to 4 μm.

During specific implementation, in the above display panel provided by the embodiments of the present disclosure, as shown in FIG. 12, FIG. 13 and FIG. 15, the angle of gradient θ2 of the micro-lens structure 7 ranges from 50° to 70°, and a width w of a bottom edge of a cross section of the micro-lens structure 7 in the thickness direction of the substrate 1 ranges from 1 μm to 8 μm, preferably from 4 μm to 5 μm.

Figure 16:
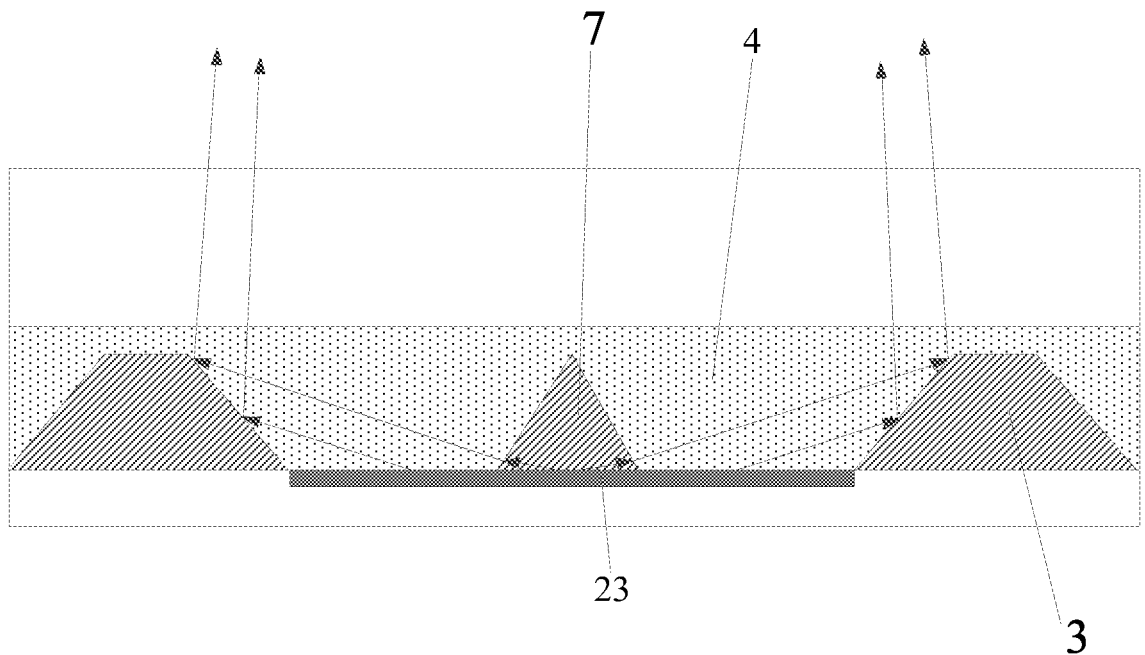
FIG. 16 is a schematic structural diagram of another display panel provided by an embodiment of the present disclosure.
Figure 17:
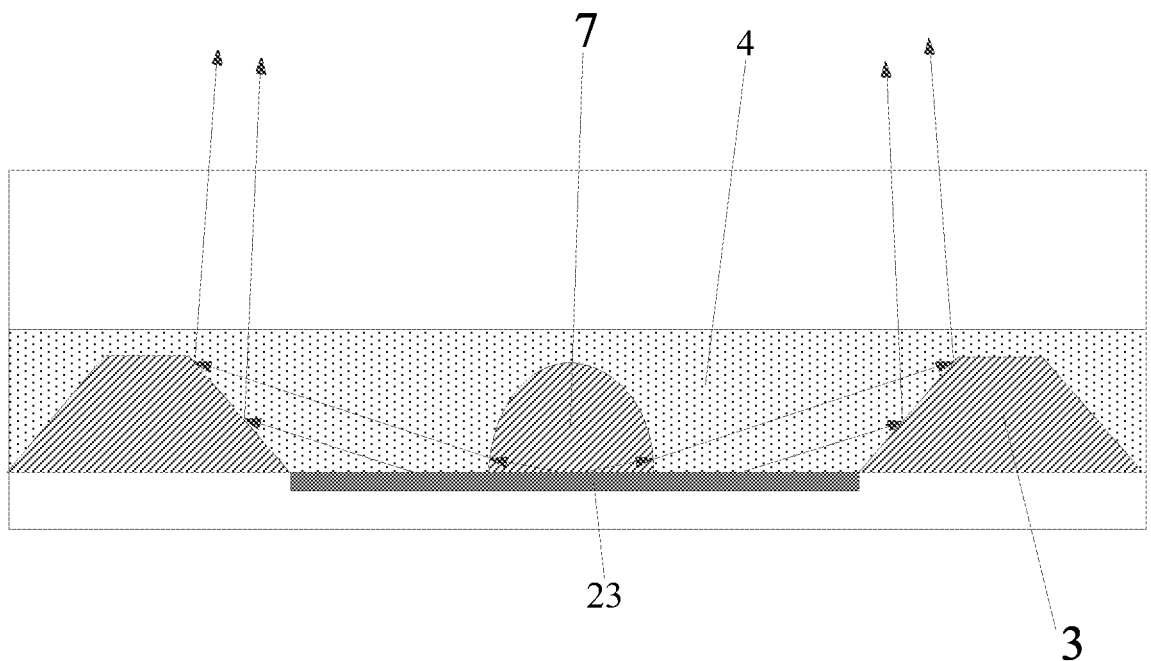
FIG. 17 is a schematic structural diagram of another display panel provided by an embodiment of the present disclosure.

During specific implementation, in the above display panel provided by the embodiments of the present disclosure, as shown in FIG. 12, FIG. 13 and FIG. 15, a cross-sectional shape of the micro-lens structure 7 in the thickness direction of the substrate 1 may be a regular trapezoid, of course, may also be other shapes. For example, as shown in FIG. 16, the cross-sectional shape of the micro-lens structure 7 in the thickness direction of the substrate 1 is a triangle; and as shown in FIG. 17, the cross-sectional shape of the micro-lens structure 7 in the thickness direction of the substrate 1 is a circular arc.

Based on the same inventive concept, embodiments of the present disclosure further provide a display apparatus, including the display panel in the above embodiments. Since the principle for solving problems of the display apparatus is similar to that of the aforementioned display panel, the implementation of the display apparatus may refer to the implementation of the aforementioned display panel, and repetitions are omitted here.

The above display apparatus provided the embodiment of the present disclosure may be a mobile phone, a tablet computer, a television, a display, a laptop, a digital photo frame, a navigator and any product or component with a display function. Other essential components of the display apparatus shall be understood by those of ordinary skill in the art, and are omitted herein and also shall not become a restriction to the present disclosure.

According to the above display panel and display apparatus provided by the embodiments of the present disclosure, since the second refractive index layer with the high refractive index covers the opening regions, and the first refractive index layer is a layer with a low refractive index, the side walls of the opening regions are the interface where the light emitted by the light emitting devices are totally reflected. In the present disclosure, the contour shape of the cross section of the side wall of the at least part of the opening regions of the first refractive index layer in the direction parallel to the surface of the substrate is set to include a plurality of concave-convex curves, in this way, the area of the side wall of the opening region may be increased, the interface area of total reflection may be increased, so that the number of light that is totally reflected is improved, and the light emitting gain of the light emitting device is improved.

Obviously, those skilled in the art may make various modifications and variations to the present disclosure without departing from the spirit and scope of the present disclosure. In this way, if these modifications and variations of the present disclosure fall within the scope of the claims of the present disclosure and equivalent technologies thereof, the present disclosure is also intended to include these modifications and variations.

What is claimed is:

1. A display panel, comprising:
   a substrate;
   a plurality of light emitting devices with different light emitting areas, wherein the light emitting devices are arranged on the substrate;
   a first refractive index layer, comprising a plurality of opening regions corresponding to the plurality of light emitting devices; wherein projections of the plurality of opening regions on the substrate at least partially overlap projections of the plurality of light emitting devices on the substrate, a contour shape of a cross sections of a side wall of at least part of the plurality of opening regions in a direction parallel to a surface of the substrate comprises a plurality of concave-convex curves, and the first refractive index layer is configured to reflect light emitted by the plurality of light emitting devices on the side wall; and
   a second refractive index layer, arranged on a side, facing away from the substrate, of the first refractive index layer; wherein the second refractive index layer is arranged on a whole surface and fills the plurality of opening regions, and a refractive index of the second refractive index layer is greater than a refractive index of the first refractive index layer.

2. The display panel according to claim 1, wherein in the direction parallel to the surface of the substrate, in the side wall of the opening region corresponding to the light emitting device with a maximum light emitting area, a top edge and/or a bottom edge of the side wall comprises the plurality of concave-convex curves.

3. The display panel according to claim 2, wherein in the direction parallel to the surface of the substrate, a shape of each of the curves is an 'S' shape or a 'Z' shape.

4. The display panel according to claim 1, wherein the substrate comprises a plurality of first sub-pixel regions, a plurality of second sub-pixel regions and a plurality of third sub-pixel regions of different colors;
   the plurality of light emitting devices with the different light emitting areas comprise a first area light emitting device, a second area light emitting device and a third area light emitting device;
   the first area light emitting device corresponds to the first sub-pixel region, the second area light emitting device corresponds to the second sub-pixel region, and the third area light emitting device corresponds to the third sub-pixel region;
   a light-emitting efficiency of the third sub-pixel region is lower than a light-emitting efficiency of the first sub-pixel region and a light-emitting efficiency of the second sub-pixel region; and
   in the side wall of the opening region corresponding to the third sub-pixel region, a top edge and/or a bottom edge of the side wall comprises the plurality of concave-convex curves.

5. The display panel according to claim 1, wherein in a thickness direction of the substrate, a cross-sectional shape of each of the plurality of opening regions is approximately an inverted trapezoid.

6. The display panel according to claim 1, further comprising a micro-lens structure disposed in the at least part of the plurality of opening regions;
   wherein an area of an orthographic projection of the micro-lens structure on the substrate is smaller than an area of an orthographic projection of the at least part of the plurality of opening regions on the substrate; and
   the micro-lens structure and the first refractive index layer are arranged on a same layer.

7. The display panel according to claim 6, wherein the micro-lens structure is disposed in the opening region corresponding to the light emitting device with a maximum light emitting area.

8. The display panel according to claim 7, wherein the micro-lens structure is disposed in a central region of the opening region.

9. The display panel according to claim 7, wherein an angle of gradient of the micro-lens structure and an angle of gradient of the first refractive index layer are approximately same; and
   a height of the micro-lens structure and a height of the first refractive index layer are same.

10. The display panel according to claim 7, wherein a cross-sectional shape of the micro-lens structure in a thickness direction of the substrate is a regular trapezoid, a triangle or a circular arc.

11. The display panel according to claim 7, wherein the angle of gradient of the micro-lens structure ranges from 50° to 70°, and a width of a bottom edge of a cross section of the micro-lens structure in the thickness direction of the substrate ranges from 1 μm to 8 μm.

12. The display panel according to claim 1, further comprising an encapsulation layer disposed on a side, facing away from the substrate, of the second refractive index layer;
   wherein each of the plurality of light emitting devices comprises an anode, a light emitting layer and a cathode sequentially arranged on the substrate in a stacked mode; and
   the first refractive index layer is disposed between the cathode and the second refractive index layer;
   wherein a material of the first refractive index layer comprises polyimide, and a material of the second refractive index layer comprises SiNx.

13. The display panel according to claim 1, further comprising an encapsulation layer disposed between the plurality of light emitting devices and the first refractive index layer.

14. The display panel according to claim 13, further comprising:
   a touch structure disposed between the encapsulation layer and the second refractive index layer; and
   a flat layer disposed between the touch structure and the second refractive index layer; wherein the flat layer is multiplexed as the first refractive index layer.

15. The display panel according to claim 14, wherein the touch structure comprises a first touch electrode layer, a touch insulation layer and a second touch electrode layer which are stacked;
   the first touch electrode layer is close to the substrate; and
   the first refractive index layer is arranged on a side, far away from the substrate, of the second touch electrode layer.

16. The display panel according to claim 15, wherein the first touch electrode layer and the second touch electrode layer comprise a plurality of metal grids, the plurality of metal grids comprise a plurality of metal wires, and the plurality of metal wires are staggered to define meshes of the plurality of metal grids;

an orthographic projection of each of the plurality of metal wires on the substrate is disposed between adjacent light emitting devices, and the first refractive index layer covers the plurality of metal wires.

17. The display panel according to claim 13, wherein a material of the first refractive index layer comprises resin, and a material of the second refractive index layer comprises resin mixed with acrylic particles or an acrylic material.

18. The display panel according to claim 1, wherein the plurality of light emitting devices comprise a red light emitting device, a green light emitting device and a blue light emitting device; and the light emitting device with a maximum light emitting area is the blue light emitting device.

19. The display panel according to claim 1, wherein an area of an orthographic projection of the opening region on the substrate is greater than or equal to an area of an orthographic projection of an effective light emitting region of a corresponding light emitting device on the substrate.

20. A display apparatus, comprising the display panel according to claim 1.

* * * * *